(12) United States Patent  
Olariu

(10) Patent No.: US 7,704,786 B2  
(45) Date of Patent: Apr. 27, 2010

(54) PRINTED ORGANIC LOGIC CIRCUITS USING A FLOATING GATE TRANSISTOR AS A LOAD DEVICE

(75) Inventor: Viorel Olariu, Colorado Springs, CO (US)

(73) Assignee: OrganicID Inc., Colorado Springs, CO (US)

( * ) Notice: Subject to any disclaimer, the term of this patent is extended or adjusted under 35 U.S.C. 154(b) by 192 days.

(21) Appl. No.: 11/964,549

(22) Filed: Dec. 26, 2007

(65) Prior Publication Data

US 2009/0170238 A1 Jul. 2, 2009

(51) Int. Cl.  
*H01L 29/76* (2006.01)

(52) U.S. Cl. .......................... 438/99; 257/369; 257/40; 257/E21.422

(58) Field of Classification Search ...................... 438/99  
See application file for complete search history.

(56) References Cited

U.S. PATENT DOCUMENTS

| | | | | |
|---|---|---|---|---|
| 5,463,586 | A * | 10/1995 | Chao et al. ................... | 365/205 |
| 5,970,318 | A * | 10/1999 | Choi et al. .................... | 438/99 |
| 6,087,196 | A * | 7/2000 | Sturm et al. ................. | 438/29 |
| 6,284,562 | B1 * | 9/2001 | Batlogg et al. ................ | 438/99 |
| 6,319,773 | B1 * | 11/2001 | Noble et al. ................. | 438/258 |
| 6,362,509 | B1 * | 3/2002 | Hart ........................... | 257/369 |
| 6,958,628 | B2 * | 10/2005 | Zanchi ........................ | 326/93 |
| 7,160,754 | B2 * | 1/2007 | Bao et al. .................... | 438/99 |
| 2002/0039096 | A1 * | 4/2002 | Katsutani .................... | 345/204 |
| 2002/0047155 | A1 * | 4/2002 | Babcock et al. ............. | 257/315 |
| 2002/0098604 | A1 * | 7/2002 | Lin et al. ..................... | 438/14 |
| 2005/0212937 | A1 * | 9/2005 | Koyama ...................... | 348/301 |

(Continued)

FOREIGN PATENT DOCUMENTS

| | | |
|---|---|---|
| DE | 103 30 064 B3 | 12/2004 |
| DE | 2006/047388 | 4/2008 |
| WO | 2006/061000 | 6/2006 |

OTHER PUBLICATIONS

Ullmann A, et al; "High Performance Organic Field-Effect Transistors and Integrated Inverters" Materials Research Society Symposium Proceedings, Materials Research society, Pittsburgh, PA, vol. 665, Apr. 20, 2001, pp. 265-270, XP008032774, ISSN: 0272-9172, pp. 265-266; figure 1; p. 269; figure 5.

*Primary Examiner*—Charles D Garber  
*Assistant Examiner*—Pape Sene  
(74) *Attorney, Agent, or Firm*—Christensen O'Connor Johnson Kindness PLLC

(57) ABSTRACT

A method of forming an organic inverter includes providing a first metal layer having a first portion for coupling a source of a first OFET to a first power supply voltage, a second portion for coupling a drain of the first OFET to an output terminal and to a source of a second OFET, and a third portion for coupling a drain of the second OFET to a second power supply voltage, providing a semiconductor layer for overlapping a portion of the first and second first metal layer portions to form a first OFET active area, and for overlapping a portion of the second and third metal layer portions to form a second OFET active area, providing a dielectric layer for overlapping the active area and isolates the first metal layer and semiconductor layer from the second metal layer, and providing a second metal layer for overlapping the active area of the first OFET to form a gate of the first OFET and an input terminal, and for overlapping the active area of the second OFET to form a floating gate for the second OFET.

22 Claims, 5 Drawing Sheets

U.S. PATENT DOCUMENTS

2006/0066644 A1  3/2006  Yamaguchi et al.
2006/0118779 A1* 6/2006  Clemens et al. ............... 257/40
2007/0254402 A1* 11/2007 Dimmler et al. .............. 438/99
2008/0200030 A1* 8/2008  Knobloch et al. ........... 438/678

* cited by examiner

NAND GATE

NOR GATE

PRINTED ORGANIC LOGIC CIRCUITS USING A FLOATING GATE TRANSISTOR AS A LOAD DEVICE

FIELD OF INVENTION

The present invention relates to organic electronic devices and circuitry used in printed circuits and, more particularly to a method of fabricating a printed organic inverter using an organic floating gate transistor as a load.

DESCRIPTION OF RELATED ART

Referring now to FIG. 1A, a prior art design of a basic printed organic inverter 100A is shown, wherein a first P-type OFET (Organic Field-Effect Transistor) is the DRIVER transistor having a source coupled to VDD, a gate for receiving the INPUT signal, and a drain for providing the OUTPUT signal. A second P-type OFET is used as a LOAD transistor having a source coupled to the drain of the first P-type OFET, and a coupled gate and drain coupled to VSS. (The gate in the LOAD transistor can also be coupled to the source instead if desired, as is known in the art).

Referring now to FIG. 1B, the same organic inverter 100A is shown as inverter 100B, which includes all of the parasitic capacitances associated with the first and second P-type OFETs. A first parasitic capacitance is CGSD, which is associated with the gate and source of the DRIVER transistor. A second parasitic capacitance is CGDD, which is associated with the gate and drain of the DRIVER transistor. Finally, a third parasitic capacitance is CGSL, which is associated with the gate and drain of the LOAD transistor.

One variation of the inverter shown in FIGS. 1A and 1B is that of a "boosted" inverter, which is used to provide full logic levels (VDD=logic one, VSS=logic zero) at the OUTPUT node. Many variations for boosted inverters are known in the art. However, these boosted inverters all require a separate boost capacitor. While a separate boost capacitor is effective to provide the additional performance required, the additional capacitor can lead to increased circuit size, increased manufacturing costs and increased manufacturing complexity.

What is desired, therefore, is a practical low cost printing method that can circumvent the described limitations of the prior art to provide a low cost and low power boosted organic inverter.

SUMMARY OF THE INVENTION

According to the present invention, a low-cost and efficient method of fabrication is disclosed that can provide a boosted organic inverter suitable for use in a wide range of applications such as replacing bar codes with active circuitry for even greater control in tracking the movement of individual and packaged goods.

The inverter and method according to an embodiment of the present invention significantly increases the speed and operating frequency of the printed electronic logic circuits into which it is incorporated.

The inverter and method according to an embodiment of the present invention significantly reduces the power consumption of the printed electronic logic circuits into which it is incorporated.

The inverter and method according to an embodiment of the present invention reduces the area occupied by the printed electronic logic circuitry into which it is incorporated, thus allowing for a much denser design.

According to an embodiment of the present invention, a method of forming an organic inverter includes providing a first metal layer having a first portion for coupling a source of a first OFET to a first power supply voltage, a second portion for coupling a drain of the first OFET to an output terminal and to a source of a second OFET, and a third portion for coupling a drain of the second OFET to a second power supply voltage, providing a semiconductor layer for overlapping a portion of the first and second first metal layer portions to form a first OFET active area, and for overlapping a portion of the second and third metal layer portions to a second OFET active area, providing a dielectric layer for overlapping the active area and isolates the first metal layer and semiconductor layer from the second metal layer, and providing a second metal layer for overlapping the active area of the first OFET to form a gate of the first OFET and an input terminal, and for overlapping the active area of the second OFET to form a floating gate for the second OFET.

The first metal layer is printed using a layer of conductive ink including conductive polymer. The semiconductor layer is printed using a polymer layer including polythiophene. The semiconductor layer comprises a patterned semiconductor layer or a sheet semiconductor layer. The dielectric layer is printed using a polymer layer including non-conductive polymer. The dielectric layer comprises a patterned dielectric layer or a sheet dielectric layer. The second metal layer is printed using a layer of conductive ink including conductive polymer. The first metal layer is typically printed on a substrate that include glass, plastic, cardboard, or any other material. The OFETs in the inverter are typically P-type transistors, and the boost capacitor is provided by the parasitic gate-to-source capacitance of the second OFET.

According to the method of the present invention, a first level metal source contact of the second OFET is formed to have a larger area than a first level metal drain contact of the second OFET, wherein the ratio of the area of the first level metal source contact of the second OFET to the area of the first Level metal drain contact of the second OFET is equal to N, wherein N is a positive number. In a preferred embodiment, N is equal to three.

BRIEF DESCRIPTION OF THE DRAWINGS

The present invention is illustrated by way of example and not by limitation in the accompanying figures in which like reference numerals indicate similar elements and in which.

DETAILED DESCRIPTION

Figure 2A:
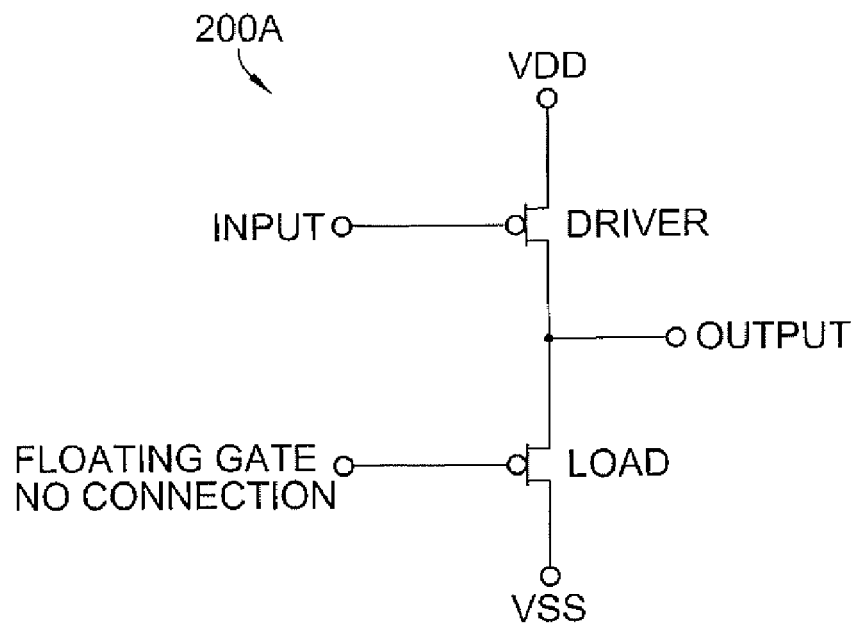
FIG. 2A is a schematic of a boosted organic inverter according to the present invention.

Referring now to FIG. 2A, a printed organic inverter 200A is shown, wherein a first P-type OFET (Organic Field-Effect Transistor) is the DRIVER transistor having a source coupled to VDD, a gate for receiving the INPUT signal, and a drain for providing the OUTPUT signal. A second LOAD transistor has a source coupled to the drain of the first DRIVER P-type OFET, and a drain coupled to VSS. Note in FIG. 2A that the gate of the LOAD transistor is floating. This is designated by the label "FLOATING GATE—NO CONNECTION".

Figure 2B:
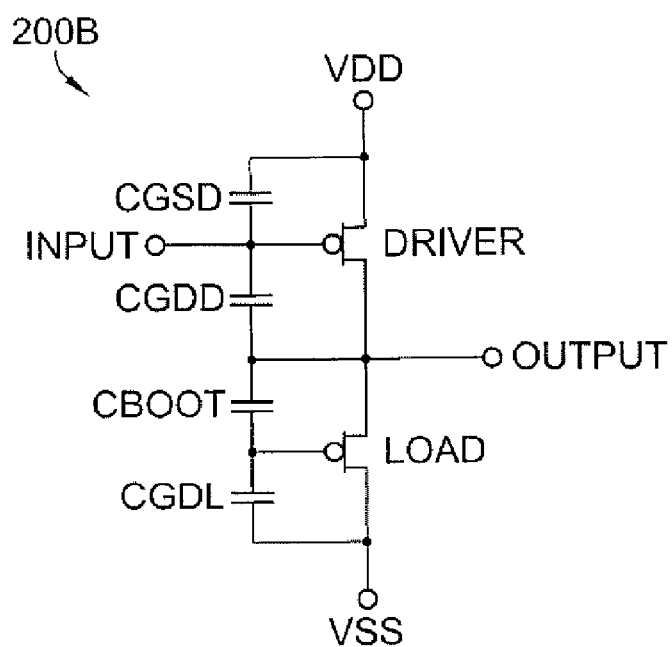
FIG. 2B is a schematic of a boosted organic inverter showing the corresponding parasitic capacitances according to the present invention.

Referring now to FIG. 2B, the same organic inverter 200A is shown as inverter 200B, which includes all of the parasitic capacitances associated with the first and second P-type OFETs. A first parasitic capacitance is CGSD, which is associated with the gate and source of the DRIVER transistor. A second parasitic capacitance is CGDD, which is associated with the gate and drain of the DRIVER transistor. A third parasitic capacitance is CBOOT, which is associated with the source and gate of the LOAD transistor. Finally, a fourth parasitic capacitance is CGDL, which is associated with the gate and drain of the LOAD transistor.

Figure 1A:
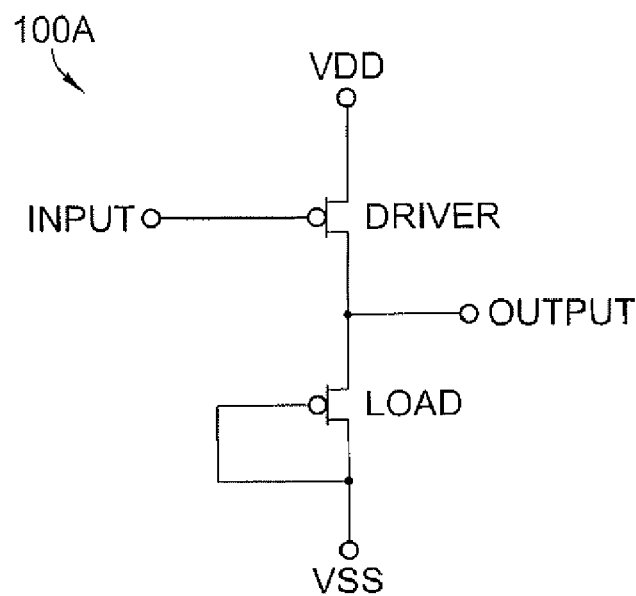
FIG. 1A is a schematic of an organic inverter according to the prior art.
Figure 1B:
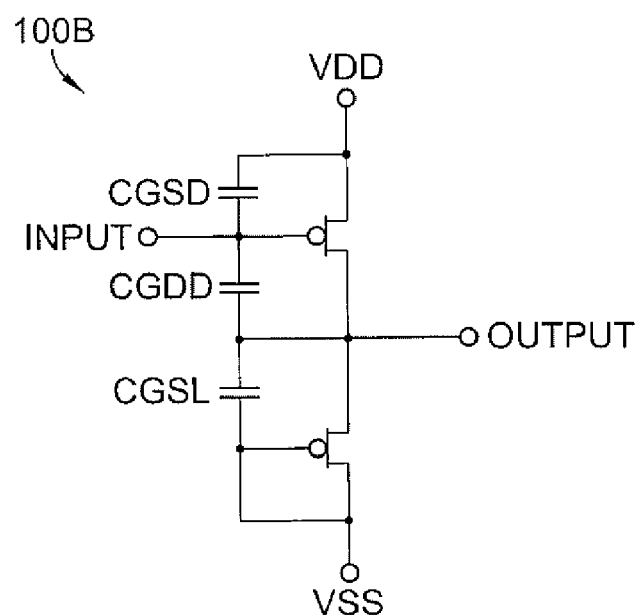
FIG. 1B is a schematic of an organic inverter showing the corresponding parasitic capacitances according to the prior art.

For the organic inverter shown in FIGS. 2A and 2B the parasitic CBOOT capacitance is used as an actual circuit element, the operation of which is described below. All of the parasitic capacitors shown in FIGS. 1B and 2B are parasitic capacitors due to the inherent overlap between the gate and the source/drain metal layers formed in the printing process, except for the CBOOT capacitance shown in FIG. 2B. The parasitic capacitance, CBOOT, can be made to exceed the value of the inherent overlap capacitor and will be described below in connection with FIGS. 3 and 4. The dimensions of the layout of the inverter according to the present invention can be altered to increase the value of the CBOOT capacitor in order to improve performance. The improvement in performance (full logic levels at the OUTPUT node) is made without a significant increase in power, fabricating costs, or size, when compared with an existing non-boosted inverter as is shown in FIG. 1A.

Figure 3:
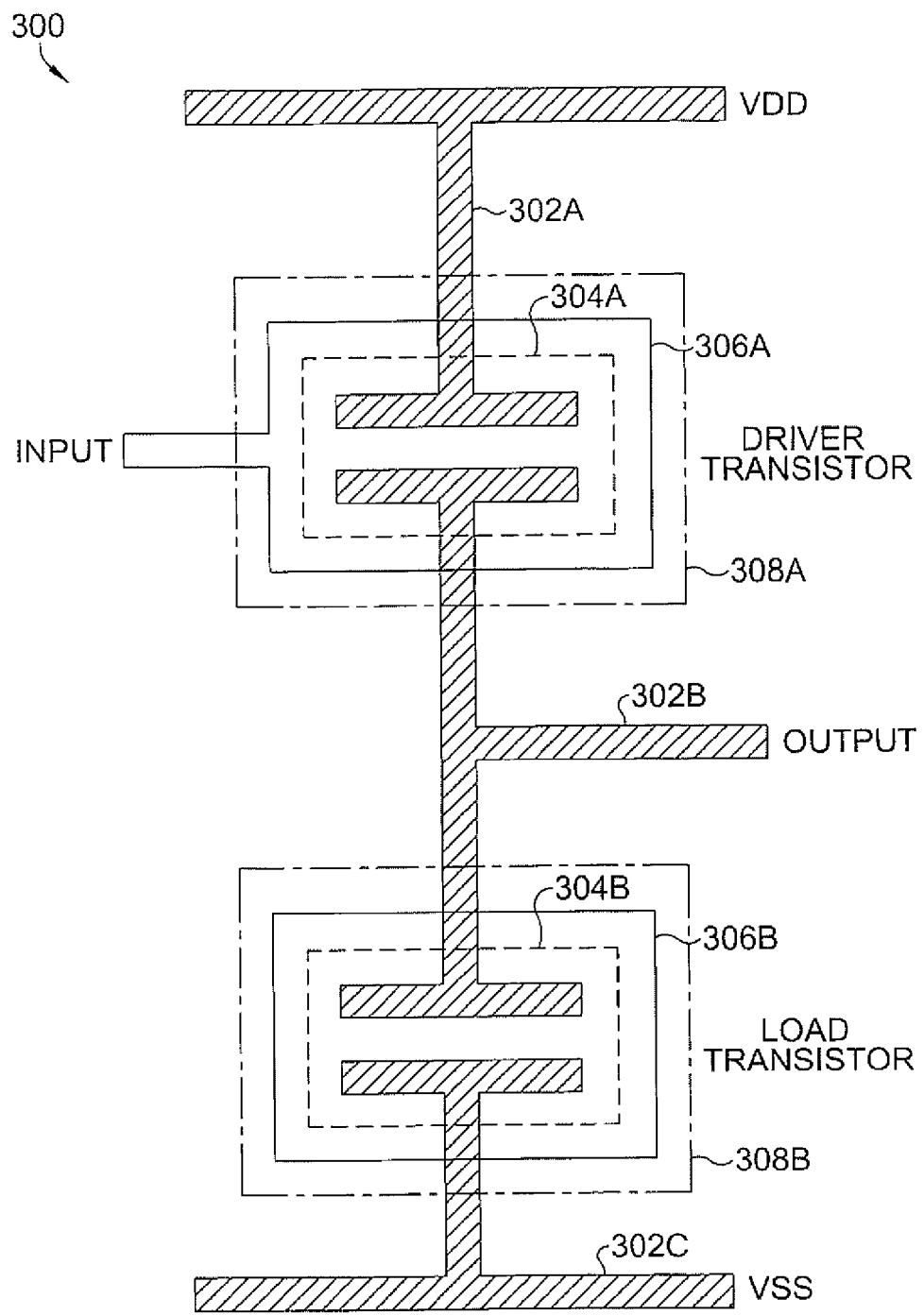
FIG. 3 is a layout of a boosted organic inverter according to a first embodiment of the present invention showing a first metal layer, a semiconductor layer, a dielectric layer, and a second metal layer.

Referring now to FIG. 3, a practical low cost printing method that can circumvent the described limitations of the prior art to provide a low cost and low power organic inverter is described with reference to organic inverter layout 300. A method of forming an organic inverter includes providing a first metal layer having a first portion 302A for coupling a source of a DRIVER transistor OFET to a first power supply voltage VDD, a second portion 302B for coupling the drain of the DRIVER transistor OFET to an OUTPUT terminal and a source of a LOAD transistor, and a third portion 302C for coupling a drain of the LOAD transistor to a second power supply voltage VSS. Once the first level metal is formed, a semiconductor layer is then formed. A semiconductor layer 304A for overlapping a portion of the first and second first metal layer portions 302A and 302B forms the OFET active area of the DRIVER transistor. A semiconductor layer 304B (printed from the same semiconductor material as semiconductor layer 304A) for overlapping a portion of the second and third metal layer portions 302B and 302C forms the active area of the LOAD transistor. Once the semiconductor layer is formed, a dielectric layer is then formed. A dielectric layer 308A overlaps a portion of the first and second metal layer portions 302A and 302B and the semiconductor layer 304A isolates the first metal layer and the semiconductor layer from the second metal layer 306A. A dielectric layer 308B (printed from the same dielectric material as dielectric layer 308A) overlaps a portion of the second and third first metal layer portions 302B and 302C and the semiconductor layer 304B isolates the first metal layer and the semiconductor layer 304B from the second metal layer 306B. A second metal layer 306A and 306B overlaps the active area of the DRIVER transistor forms a gate of the OFET and an INPUT terminal for the inverter 300. A second metal layer 306B (printed from the same second metal layer as second metal layer 306A) for overlapping the active area of the LOAD transistor forms a gate of this OFET.

The first metal layer 302 can be provided by printing a layer of conductive ink. The conductive ink typically comprises conductive polymer although other types of conductive ink can be used. The semiconductor layer 304 comprises printing a polymer layer. The polymer layer typically comprises polythiophene although other types of polymers or other organic semiconductor layers can also be used. Semiconductor layer 304 can be patterned as shown in FIG. 3, or can comprise an un-patterned sheet of material if desired. The dielectric layer 308 comprises printing a polymer layer. The dielectric layer typically comprises non-conductive polymer although other types of polymers or other organic semiconductor layers can also be used. Dielectric layer 308 can be patterned as shown in FIG. 3, or can comprise an un-patterned sheet of material if desired. The second metal layer 306 can be provided by printing a layer of conductive ink. The conductive ink typically comprises conductive polymer although other types of conductive ink can be used. The first metal layer 302 is typically printed on a substrate comprising glass, plastic, or cardboard, as well as other materials.

Figure 4:
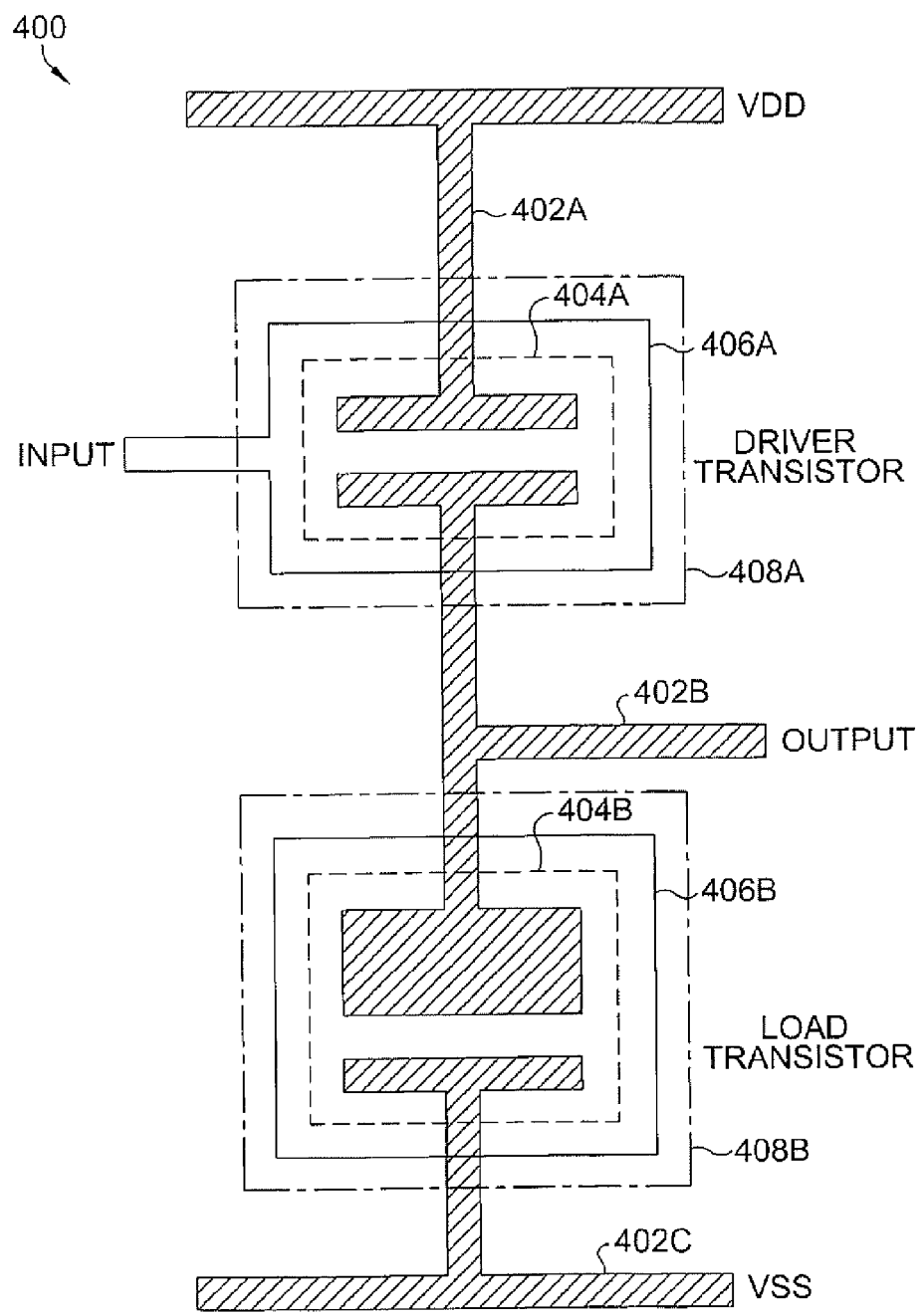
FIG. 4 is a layout of a boosted organic inverter according to a second embodiment of the present invention showing a first metal layer, a semiconductor layer, a dielectric layer, and a second metal layer.

Referring now to FIG. 4, a boosted inverter 400 is shown similar to that of boosted inverter 300 shown in FIG. 3. Of notable exception is the first level metal source contact of the LOAD transistor. While the first level metal drain contact of the LOAD transistor is substantially the same as in FIG. 3, the source contact has an area of about three times that of the drain contact so that optimum performance can be realized. The reason for the increase in size ratio, is that the source contact area determines the value of the CBOOT capacitor, which aids in providing the internal boosted voltage of organic inverter 400. In FIG. 4, the same label numerals are used, except that 400-level numerals are used to distinguish the first and second embodiments of the present invention.

For the inverter of the present invention, the gate of the LOAD transistor floats from the static (DC) point of view. In the static mode, the gate voltage of the LOAD transistor will be determined by the voltage divider provided by the parallel resistive components of parasitic capacitors CBOOT and CGDL. In the dynamic operating mode, however, CBOOT acts as a bootstrapping capacitor.

Suppose that VINPUT=VIL is in a logic low state and VOUTPUT=VOH is in a logic high state. Then VB (the voltage on the gate of the LOAD transistor)=

$$VBH = (VOH \times CBOOT)/(CGDL + CBOOT).$$

Now, suppose that VINPUT switches from the logic low level to a logic high level (VIL to VIH), and then VOUTPUT begins to switch from a high logic level to a low logic level (VOH to VOL). At this phase VB will initially switch from VBH to VBLMIN=

VOL−(VOH−VBH).

This pushes the LOAD transistor more into the saturation mode helping to bring the VOUTPUT voltage to a lower value at a much faster rate. Then VB gradually increases towards

VBL=(VOL×CBOOT)/(CGDL+CBOOT).

Now, suppose that VINPUT switches from the logic high level to a logic low level, then VOUTPUT begins to switch from a logic low level to a logic high level (VOL to VOH). At this phase VB will initially switch from VBL to VBHMAX=

VOH−(VOL−VBL),

Which is close to the VOH voltage. This pushes the LOAD transistor more into the cut-off mode, helping to bring the VOUTPUT voltage to a higher value at a much faster rate. Then VB gradually decreases towards VBH and the cycle can start again.

In the inverters 300 and 400 shown in FIGS. 3 and 4, the OFETs typically comprises a P-type transistor. However, it will be apparent to those skilled in the art that an N-type transistor can also be used with appropriate biasing. The feature sizes for the inverter shown in FIGS. 3 and 4 can range from a few microns to tens of microns, although these feature sizes will be determined by the exact printing method used, and by the requirements of a specific circuit. Although simple transistor structures are shown in FIGS. 3 and 4, it will be apparent to those skilled in the art that other structures are possible such as interdigitating metal portions 302B and 302C associated with the LOAD transistor. Metal portions 302A and 302B associated with the DRIVER transistor OFET can also be interdigitated. When forming the second metal gate of the DRIVER transistor in the inverters 300 and 400 shown in FIGS. 3 and 4, it is important that the patterned second metal portion 306A and 306B completely overlap the underlying first metal portions 302A and 302B, and 302B and 302C that form the active area of the devices.

Figure 5:
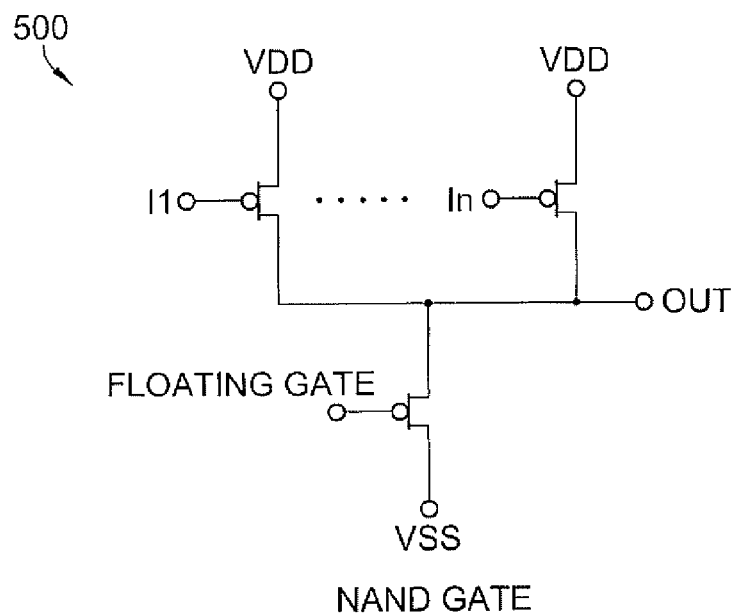
FIG. 5 is a schematic diagram of a NAND gate having multiple parallel driver transistors and a resistive load into which the inverter of the present invention can be incorporated.
Figure 6:
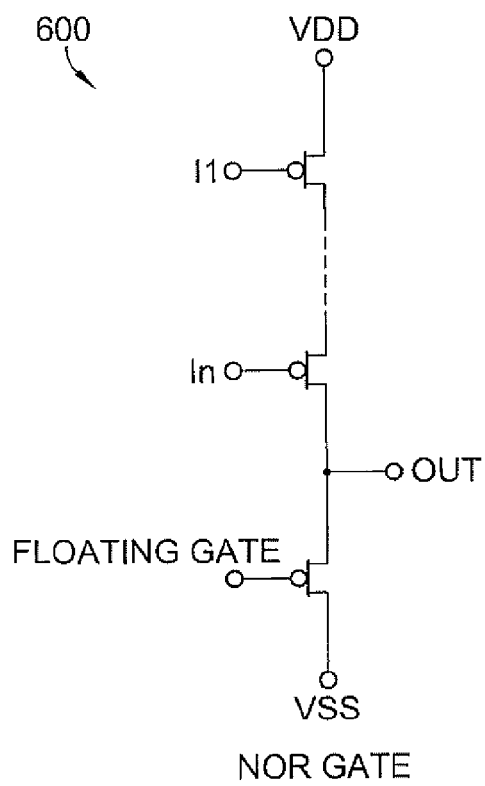
FIG. 6 is a schematic diagram of a NOR gate having multiple serial driver transistors and a resistive load into which the inverter of the present invention can be incorporated.

Referring now to FIGS. 5 and 6, it will be apparent to those skilled in the art that the inverter of the present invention can be incorporated into a NAND gate 500 having multiple parallel DRIVER transistors and a resistive load or into a NOR gate 600 having multiple serial DRIVER transistors. The inverter of the present invention can also be incorporated into other known logic gates.

While the invention has been described in detail in the foregoing description and illustrative embodiment, it will be appreciated by those skilled in the art that many variations may be made without departing from the spirit and scope of the invention. For example, the material selection of the various metal, dielectric, and semiconductor layers can be altered as desired for a specific application. In addition, the substitution of the LOAD structure of the present invention can be used in other organic logic or analog circuits and is not therefore limited to an inverter. Thus, it may be understood, for example, that the structures above could include a variety of different nano-particles, polymers and various print methodologies can be used to achieve this result. The process may also include surface treatments at various steps as well as modified transistor structures, including structures such as top-gate top-electrode, top-gate bottom-electrode, bottom gate top-electrode, bottom gate bottom electrode and vertical FETs.

I claim:

1. A method of forming an organic inverter comprising:
providing a first metal layer having a first portion for coupling a source of a first OFET to a first power supply voltage, a second portion for coupling a drain of the first OFET to an output terminal and to a source of a second OFET, and a third portion for coupling a drain of the second OFET to a second power supply voltage;
providing a semiconductor layer for overlapping a portion of the first and second first metal layer portions to form a first OFET active area, and for overlapping a portion of the second and third metal layer portions to a second OFET active area;
providing a dielectric layer for overlapping a portion of the first and second first metal layer portions and the semiconductor layer that form the first OFET active area, and for overlapping a portion of the second and third first metal layer portions and the semiconductor layer that form the second OFET active area to isolate the first metal layer and the semiconductor layer from a second metal layer; and
providing the second metal layer for overlapping the active area of the first OFET to form a gate of the first OFET and an input terminal, and for overlapping the active area of the second OFET to form a floating gate for the second OFET,
wherein the floating gate is not connected to a signal wire.

2. The method of claim 1, wherein providing the first metal layer comprises printing a layer of conductive ink.

3. The method of claim 2, wherein the conductive ink comprises conductive polymer.

4. The method of claim 1, wherein providing the semiconductor layer comprises printing a polymer layer.

5. The method of claim 4, wherein the polymer comprises polythiophene.

6. The method of claim 4, wherein the semiconductor layer comprises a patterned semiconductor layer.

7. The method of claim 4, wherein the semiconductor layer comprises a sheet semiconductor layer.

8. The method of claim 1, wherein providing the dielectric layer comprises printing a polymer layer.

9. The method of claim 8, wherein the polymer comprises non-conductive polymer.

10. The method of claim 8, wherein the dielectric layer comprises a patterned dielectric layer.

11. The method of claim 8, wherein the dielectric layer comprises a sheet dielectric layer.

12. The method of claim 1, wherein providing the second metal layer comprises printing a layer of conductive ink.

13. The method of claim 12, wherein the conductive ink comprises conductive polymer.

14. The method of claim 1, further comprising providing the first metal layer on a substrate.

15. The method of claim 14, wherein the substrate comprises glass, plastic, or cardboard.

16. The method of claim 1, wherein the OFET comprises a P-type transistor.

17. The method of claim 1, wherein the OFET comprises an N-type transistor.

18. The method of claim 1, wherein a first level metal source contact of the second OFET is formed to have a larger area than a first level metal drain contact of the second OFET.

19. The method of claim 18, wherein the ratio of the area of the first level metal source contact of the second OFET to the area of the first level metal drain contact of the second OFET is equal to N, wherein N is a positive number.

20. The method of claim 19, wherein N is equal to three.

21. The method of claim 1, further comprising incorporating the inverter into a NAND gate.

22. The method of claim 1, further comprising incorporating the inverter into a NOR gate.

* * * * *